US006877542B2

(12) United States Patent
Huseby et al.

(10) Patent No.: US 6,877,542 B2
(45) Date of Patent: Apr. 12, 2005

(54) SYSTEMS AND METHODS FOR BONDING A HEAT SINK TO A PRINTED CIRCUIT ASSEMBLY

(75) Inventors: William R Huseby, Vancouver, WA (US); John Barker, Vancouver, WA (US); Joseph Groshong, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 74 days.

(21) Appl. No.: 10/124,544

(22) Filed: Apr. 17, 2002

(65) Prior Publication Data
US 2003/0196751 A1 Oct. 23, 2003

(51) Int. Cl.⁷ ................................................ B32B 35/00
(52) U.S. Cl. .................... 156/581; 156/556; 29/739; 29/743
(58) Field of Search .................... 156/556, 295, 156/312, 580, 581, 285; 29/739, 743

(56) References Cited

U.S. PATENT DOCUMENTS

| | | | | |
|---|---|---|---|---|
| 3,664,902 A | * | 5/1972 | Papadakis | 156/580 |
| 5,092,954 A | * | 3/1992 | Braun et al. | 156/540 |
| 5,106,451 A | * | 4/1992 | Kan et al. | 156/583.3 |
| 5,300,170 A | * | 4/1994 | Donohoe | 156/235 |
| 5,308,429 A | * | 5/1994 | Bradley | 156/306.6 |
| 5,384,000 A | * | 1/1995 | Nishiguchi | 156/297 |
| 5,445,697 A | * | 8/1995 | Fitch et al. | 156/295 |
| 5,453,145 A | * | 9/1995 | Beaman et al. | 156/230 |
| 5,865,918 A | * | 2/1999 | Franklin et al. | 156/64 |
| 6,066,218 A | * | 5/2000 | Kuhn et al. | 156/87 |
| 6,130,113 A | * | 10/2000 | Eslamy et al. | 438/122 |
| 6,382,693 B1 | * | 5/2002 | Ljungmann | 294/64.1 |
| 6,626,224 B1 | * | 9/2003 | Ljungmann | 156/557 |

* cited by examiner

Primary Examiner—Melvin C. Mayes

(57) ABSTRACT

A bonding system is provided that bonds a heat sink to a printed circuit assembly. The bonding system includes an adhesive applicator that is configured to hold an adhesive layer, and a heat sink holder that is configured to hold a heat sink while the adhesive applicator applies the adhesive layer to the heat sink.

11 Claims, 6 Drawing Sheets

SYSTEMS AND METHODS FOR BONDING A HEAT SINK TO A PRINTED CIRCUIT ASSEMBLY

FIELD OF THE INVENTION

The present invention is related to printed circuit assembly manufacture and, in particular, to bonding a heat sink to a printed circuit assembly.

DESCRIPTION OF THE RELATED ART

Heat sinks are commonly used in electronic devices that generate heat. A heat sink is often bonded to the top of a printed circuit assembly (PCA), such as, for example, a CPU chip or a circuit board, to keep the printed circuit assembly cooler. A traditional method for bonding a heat sink to a printed circuit assembly typically includes placing a layer of liquid adhesive on the heat sink and then placing the printed circuit assembly on top of the liquid adhesive. The printed circuit assembly and the heat sink may be clamped together and then placed in an oven where they are baked in order for the liquid adhesive to set.

The traditional method described above for bonding a heat sink to a printed circuit assembly tends to be expensive, time consuming, and messy. Furthermore, printed circuit assemblies that are bonded using traditional methods sometimes become defective during the bonding process. In particular, the liquid adhesive can flow onto the wire bonding sites of the PCA rendering it unusable. In addition, air bubbles can form in the liquid adhesive, thereby reducing the heat sink's effectiveness. Therefore, there exists a need for improved systems and methods for bonding a heat sink to a printed circuit assembly, that address these and/or other perceived shortcomings of the prior art.

SUMMARY OF THE INVENTION

The present invention provides systems and methods for bonding a heat sink to a printed circuit assembly. Briefly described, one embodiment of a bonding system includes an adhesive applicator that is configured to hold an adhesive layer, and a heat sink holder that is configured to hold a heat sink while the adhesive applicator applies the adhesive layer to the heat sink.

The present invention can also be viewed as providing methods for bonding a heat sink to a printed circuit assembly. In this regard, one embodiment of such a method, among others, includes pressing a solid adhesive layer against the heat sink, and then pressing the printed circuit assembly against the adhesive layer.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
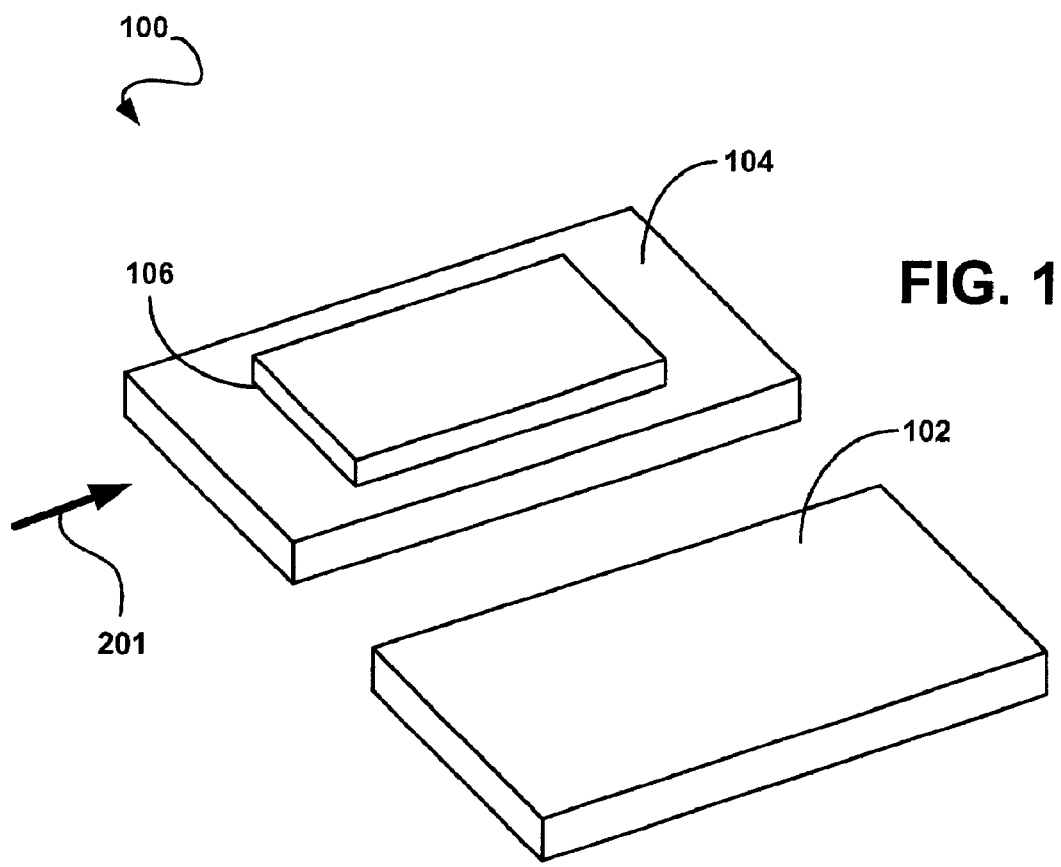
FIG. 1 depicts a non-limiting example of a heat sink bonding system in accordance with one embodiment of the present invention.
Figure 2:
FIG. 2 depicts a side view of the adhesive applicator shown in FIG. 1.

FIG. 1 depicts a non-limiting example of a heat sink bonding system 100 in accordance with one embodiment of the present invention. The bonding system 100 includes a pressure applicator 104, an adhesive applicator 106, and a heat sink holder 102. The adhesive applicator 106 is mounted on the pressure applicator 104 and has a curved surface 108 as shown in FIG. 2. The heat sink holder 102 is for holding a heat sink in place while it is being bonded to a printed circuit assembly. Although, for illustration purposes, the adhesive applicator 106, the pressure applicator 104, and the heat sink holder 102 are shown as having rectangular shapes, they may alternatively be implemented using many different shapes or combination of shapes as will be understood by those skilled in the art.

FIG. 2 depicts a side view in the direction indicated by the arrow 201 of the adhesive applicator 106 shown in FIG. 1. The adhesive applicator 106 has a curved surface 108 that is used for holding an adhesive layer and/or a printed circuit assembly that are to be bonded to a heat sink. The curved surface 108 may be curved along one axis (e.g., may have a cylindrical curve), or may be curved along a plurality of axes (e.g., may have a spherical curve). In a preferred embodiment, the curved surface 108 is curved along the longer axis of the adhesive applicator 106. The curved surface 108 may have holes 120 (FIG. 8) for providing suction for holding an adhesive layer and/or a printed circuit assembly during application of the adhesive layer. Furthermore, the curved surface 108 is compliant and may, therefore, be substantially flattened during the application of the adhesive layer and the printed circuit assembly, respectively, as will be discussed in more detail below.

Figure 3A:
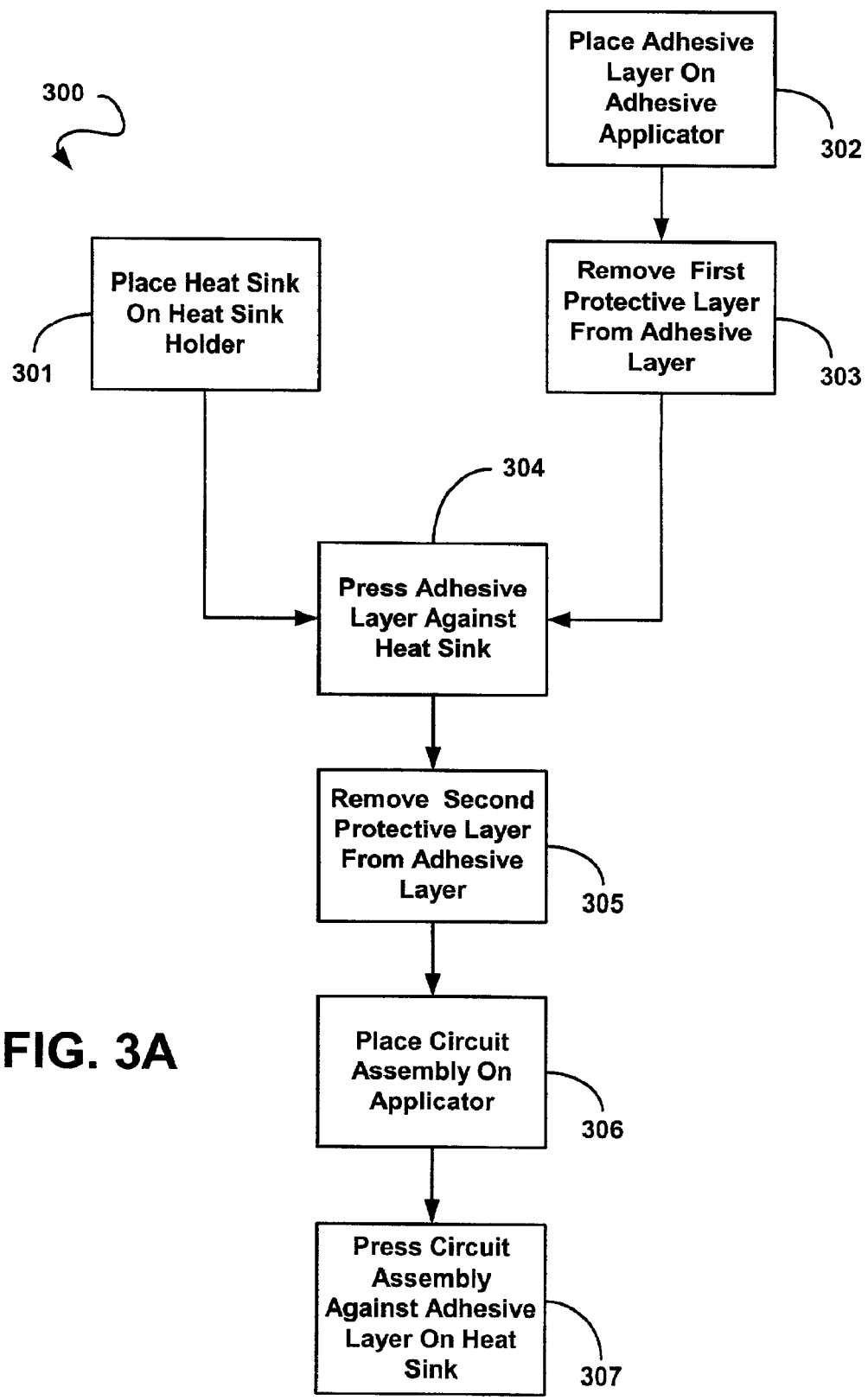
FIG. 3A is a flow chart depicting a method that may be implemented using the bonding system of FIG. 1.

FIG. 3A is a flow chart depicting a non-limiting example of a method 300 in accordance with one embodiment of the present invention. In step 301, a heat sink is placed on a heat sink holder. An indentation in the heat sink holder and/or protrusions of the holder may be used to accurately position the heat sink relative to the heat sink holder. The heat sink may be kept in place by, for example, applying suction via holes in the heat sink holder. In step 302, which may be performed before, after, and/or during step 301, an adhesive layer is placed on the adhesive applicator 106. The adhesive layer is preferably a pressure sensitive adhesive that has two opposing adhesive surfaces, and that is applied by exerting pressure over a surface of the adhesive. The adhesive layer may have a protective layer temporarily attached to each of its adhesive surfaces. The protective layers prevent the adhesive layer from accidentally adhering to an object, and are similar in function to those that are attached to new stickers (e.g., new vehicle bumper stickers). In step 303, a protective layer is removed from the surface of the adhesive layer that is facing away from the adhesive applicator 106. After steps 301–303 are performed, the adhesive layer is pressed against the heat sink in step 304 by applying force via the pressure applicator. Pressing the adhesive layer against the heat sink causes the adhesive layer to bond to the heat sink. After the adhesive layer bonds to the heat sink, the second protective layer is removed from the adhesive layer in step 305.

In step 306, which may be performed before, after, or concurrently with step 305, a printed circuit assembly is placed on the adhesive applicator 106. An indentation in the adhesive applicator 106 and/or protrusions from it may be used to accurately position the printed circuit assembly on the adhesive applicator 106. The printed circuit assembly may be kept in place by, for example, providing suction via holes in the adhesive applicator 106. After the printed circuit assembly is placed on the adhesive applicator 106, the printed circuit assembly is pressed against the adhesive layer in step 307 by applying force via the pressure applicator. Pressing the printed circuit assembly against the adhesive layer causes the printed circuit assembly to bond to the heat sink via the adhesive layer. Hundreds or even thousand of pounds of pressure may be applied via the pressure applicator in order to properly bond the printed circuit assembly to the heat sink.

Figure 3B:
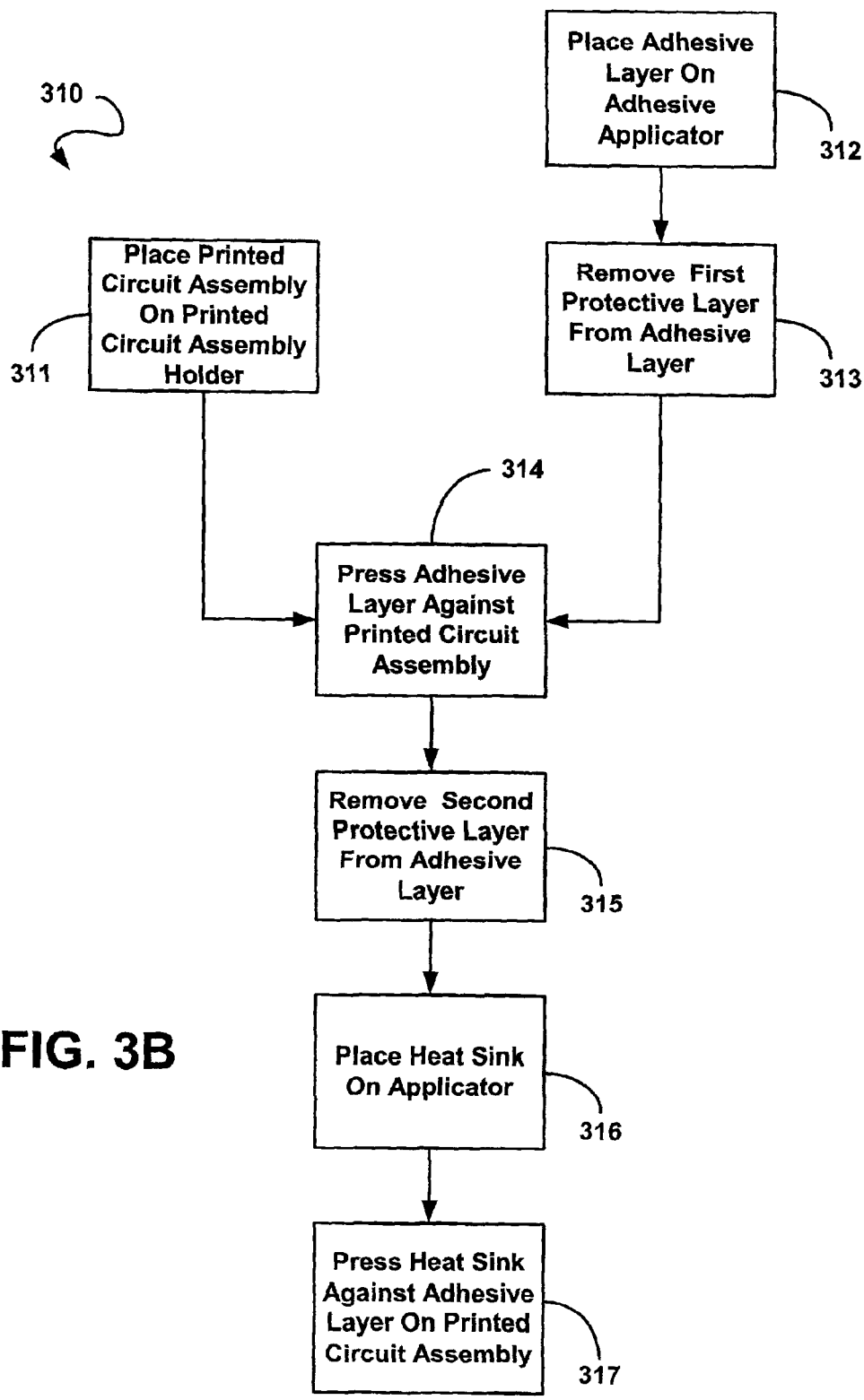
FIG. 3B is a flow chart depicting another method that may be implemented using the bonding system of FIG. 1.

FIG. 3B is a flow chart depicting a non-limiting example of a method 310 in accordance with an alternative embodiment of the present invention. In step 311, a printed circuit assembly is placed on a printed circuit assembly holder. In step 312, which may be performed before, after, and/or during step 311, an adhesive layer is placed on an adhesive applicator 106. The adhesive layer is preferably a pressure sensitive adhesive that has two opposing adhesive surfaces, and that is applied by exerting pressure over a surface of the adhesive. The adhesive layer may have a protective layer temporarily attached to each of its adhesive surfaces. In step 313, the first protective layer is removed from the surface of the adhesive layer that is facing away from the adhesive applicator 106.

After steps 311–313 are performed, the adhesive layer is pressed against the printed circuit assembly in step 314 by applying force via the pressure applicator. Pressing the adhesive layer against the printed circuit assembly causes the adhesive layer to bond to the printed circuit assembly. After the adhesive layer bonds to the printed circuit assembly, the second protective layer is removed from the adhesive layer in step 315.

In step 316, which may be performed before, during, or after step 315, a heat sink is placed on the adhesive applicator 106. The heat sink is then pressed against the adhesive layer by applying force via the pressure applicator. Pressing the heat sink against the adhesive layer causes the heat sink to bond to the printed circuit assembly via the adhesive layer.

Figure 4:
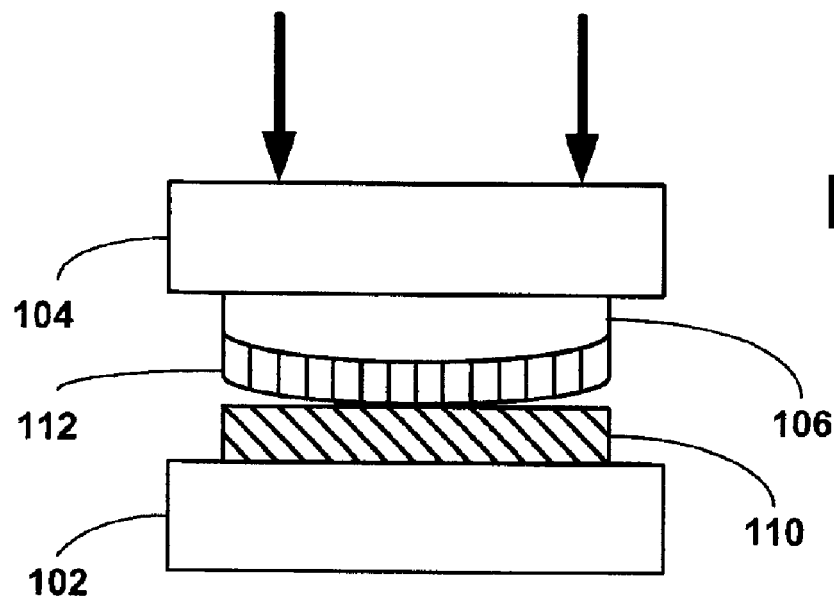
FIGS. 4 and 5 depict a non-limiting example of the bonding system of FIG. 1 that is in the process of applying an adhesive layer to a heat sink.
Figure 5:
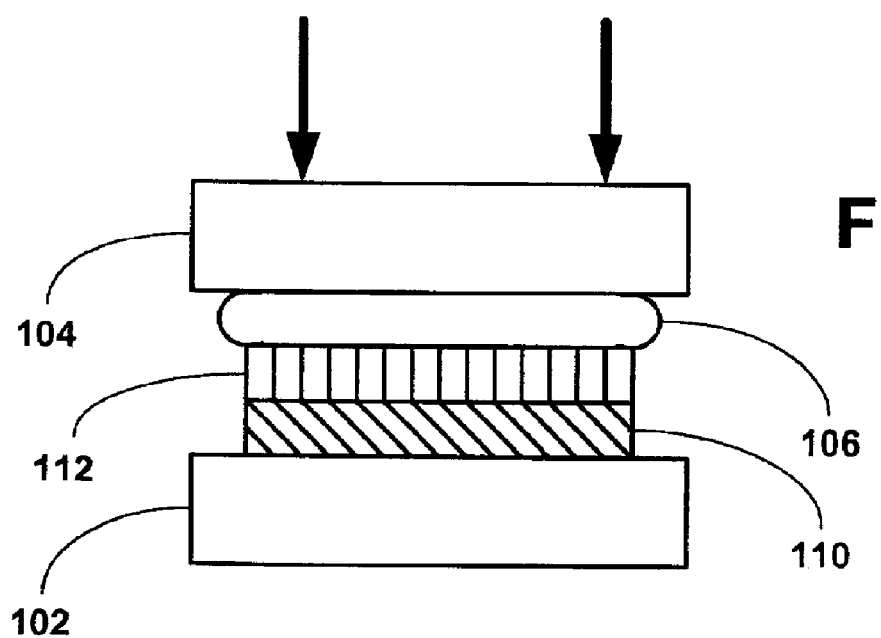

FIGS. 4 and 5 depict a non-limiting example of a bonding system 100 that is in the process of applying an adhesive layer 112 to a heat sink 110. As shown in FIG. 4, force is applied on the pressure applicator 104 thereby causing the adhesive layer 112 to come into contact with the heat sink 110. In an alternative embodiment, force may be applied to the heat sink holder 102. As the adhesive layer 112 is pushed toward the heat sink 110, the first contact between the two components is in the middle, either along an axis of the curved surface 108 or at a central point. Then, as the adhesive layer 112 is pushed against the heat sink 110, the adhesive applicator 106 becomes compressed and/or is flattened, and additional portions of the two components come into contact with each other. Eventually, the formerly curved surface 108 of the adhesive applicator 106 is substantially flattened and the bottom surface of the adhesive layer 112 comes into full contact with the heat sink 110, as shown in FIG. 5. In this manner, no significant air bubbles or voids are formed between the adhesive layer 112 and the heat sink 110 as they are bonding.

Figure 6:
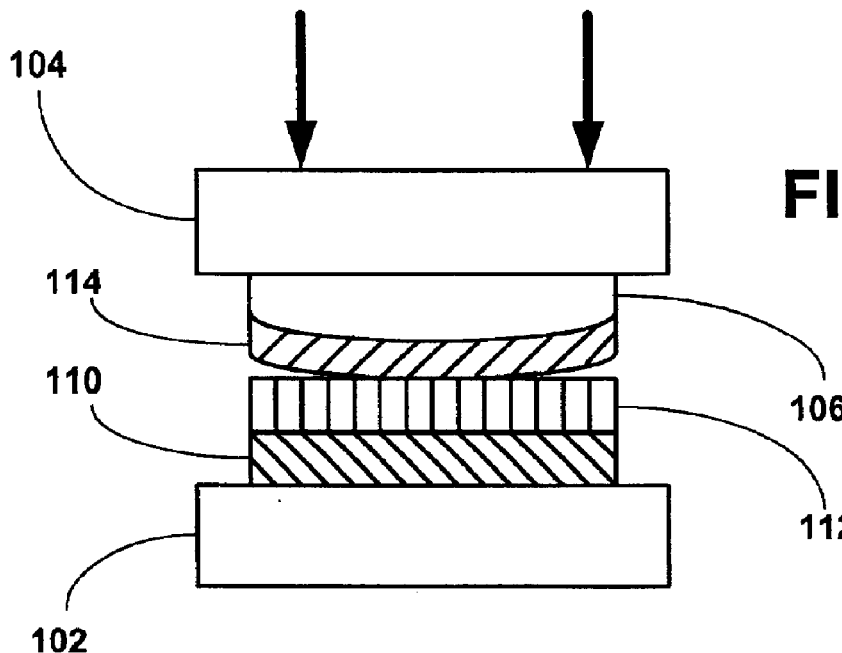
FIGS. 6 and 7 depict a non-limiting example of the bonding system of FIG. 1 that is in the process of applying a printed circuit assembly to an adhesive layer.
Figure 7:
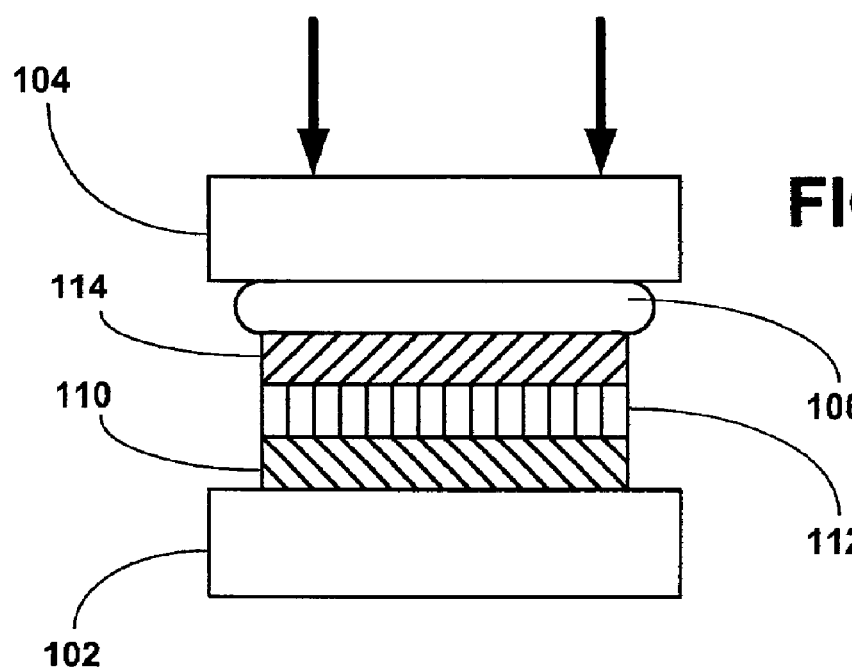

FIGS. 6 and 7 depict a non-limiting example of a bonding system 100 that is in the process of applying a printed circuit assembly 114 to an adhesive layer 112. As shown in FIG. 6, force is applied on the pressure applicator 104 thereby causing the printed circuit assembly 114 to come into contact with the adhesive layer 112. In an alternative embodiment, force may be applied to the heat sink holder 102. As the printed circuit assembly 114 is pushed toward the adhesive layer 112, the first contact between the two components is in the middle, either along an axis of the adhesive applicator 106's curved surface 108 or at a central point. Then, as the printed circuit assembly 114 is pushed against the adhesive layer 112, the adhesive applicator 106 becomes compressed and/or is flattened, and a gradually larger portion of the two components come into contact with each other. Eventually, the formerly curved surface 108 of the adhesive applicator 106 is substantially flattened and the bottom surface of the printed circuit assembly 114 comes into full contact with the adhesive layer 112, as shown in FIG. 7. In this manner, the printed circuit assembly 114 is bonded to the heat sink 110 via the adhesive layer 112 without any significant air bubbles or voids being formed between the two components.

Figure 8:
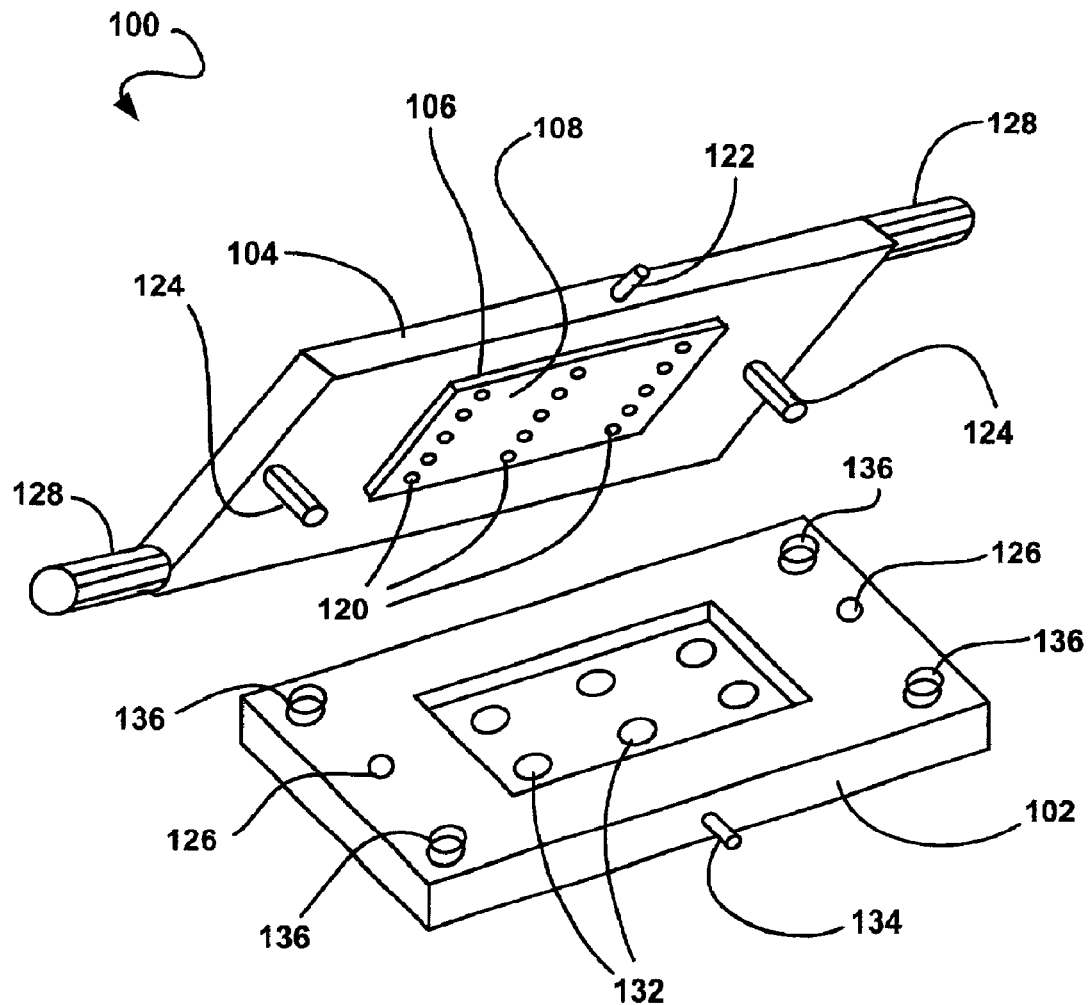
FIG. 8 depicts one possible configuration of the bonding system of FIG. 1.

FIG. 8 depicts a non-limiting example of a heat sink bonding system 100 in accordance with one embodiment of the present invention. The bonding system 100 includes a pressure applicator 104, an adhesive applicator 106, and a heat sink holder 102. The adhesive applicator 106 is mounted on the pressure applicator 104 and has a curved surface 108 (as shown in FIG. 2). The adhesive applicator 106 also includes holes 120 for providing suction for holding an adhesive layer 112 and/or a printed circuit assembly 114 during the respective component's addition to the heat sink 110 assembly. The pressure applicator 104 includes handles 128 that can be used to lift and turn over the pressure applicator 104, guide pins 124 for guiding the movement of the pressure applicator 104 onto the heat sink holder 102, and a suction valve 122 that can be connected to a suction pump (not shown) for creating suction via the holes 120.

The heat sink holder 102 is for holding a heat sink 110 in place while it is being bonded to a printed circuit assembly 114. The heat sink holder 102 includes an indented surface for properly positioning a heat sink 110. Holes 132 in the heat sink holder 102 provide suction for holding the heat sink 110 in position during the bonding process. The heat sink holder 102 also includes holes 126 for receiving guide pins 124. A suction valve 134 can be connected to a suction pump for providing suction via the holes 132. The suction provided via the upper holes 120 and the lower holes 132 provides the resistance necessary to help separate an adhesive layer 112 from the adhesive applicator 106. Metal springs 136 provide resistance for pushing the pressure applicator 104 away from the heat sink holder 102. The force provided by the springs 136 helps to separate the adhesive layer 112 from the adhesive applicator 106 after the adhesive layer 112 bonds with a heat sink 110.

It should be emphasized that the above-described embodiments of the present invention are merely possible examples setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A bonding system for bonding a heat sink and a printed circuit assembly together, said bonding system comprising:

an adhesive applicator having a first compliant surface and an opposing second surface, the first compliant surface being sized and shaped to receive an adhesive layer;

a pressure applicator engaging the adhesive applicator, a first surface of the pressure applicator engaging the second surface of the adhesive applicator and being operative to apply pressure to the adhesive applicator in response to receiving a force via a second surface of the pressure applicator; and a heat sink holder having a recessed portion sized and shaped to receive a heat sink and to maintain a position of the heat sink while the printed circuit assembly and the heat sink are being bonded together, wherein:

the first compliant surface exhibits a curved shape when a compressive force is not applied thereto, the first compliant surface being further configured to deform when a compressive force is applied thereto, and to regain the curved shape when the compressive force is removed;

the adhesive applicator has suction holes formed therethrough for providing suction to hold the adhesive layer;

resilient members are attached to the heat sink holder for urging the pressure applicator away from the heat sink holder;

guide pins extend from the first surface of the pressure applicator; and the heat sink holder has receptive holes for receiving said guide pins such that insertion of said guide pins into said receptive holes aligns said pressure applicator with said heat sink holder.

2. The bonding system of claim 1, further comprising a pump configured to provide the suction.

3. The bonding system of claim 1, wherein the adhesive applicator is further configured to hold the printed circuit assembly after the adhesive layer is applied to the heat sink.

4. The bonding system of claim 1, wherein the adhesive layer is a pressure sensitive adhesive layer.

5. The bonding system of claim 1, further comprising a non-adhesive layer attached to a first side of the adhesive layer.

6. The bonding system of claim 5, wherein the non-adhesive layer is removed after a second side of the adhesive layer is applied to the heat sink and before the printed circuit assembly is attached to the first side of the adhesive layer.

7. The bonding system of claim 1, wherein the compression force deforming the first compliant surface is applied while the adhesive layer is being applied to the heat sink.

8. The bonding system of claim 7, wherein the compression force deforming the first compliant surface is further applied while the printed circuit assembly is applied to the adhesive layer.

9. A bonding system for bonding a heat sink to a printed circuit assembly, comprising:

an adhesive applicator having a compliant surface, the compliant surface having a curved shape and being configured to hold an adhesive layer, the compliant surface being further configured to deform while the adhesive layer is being applied to the heat sink, and to regain its curved shape after the adhesive layer is applied to the heat sink; and a heat sink holder that is configured to hold the heat sink using suction that is applied through holes in a surface of the heat sink holder.

10. The bonding system of claim 9, wherein the compliant surface is configured to hold the adhesive layer via a non-adhesive layer that is attached to the adhesive layer.

11. The bonding system of claim 9, further comprising a pump configured to provide the suction.

* * * * *